US010090216B2

(12) United States Patent
Meyer-Berg et al.

(10) Patent No.: US 10,090,216 B2
(45) Date of Patent: *Oct. 2, 2018

(54) SEMICONDUCTOR PACKAGE WITH INTERLOCKED CONNECTION

(71) Applicant: Infineon Technologies AG, Neubiberg (DE)

(72) Inventors: Georg Meyer-Berg, München (DE); Reinhard Pufall, München (DE); Michael Goroll, Poing (DE); Rainer Dudek, Chemnitz (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/442,084

(22) Filed: Feb. 24, 2017

(65) Prior Publication Data

US 2017/0170082 A1    Jun. 15, 2017

Related U.S. Application Data

(62) Division of application No. 13/939,248, filed on Jul. 11, 2013, now Pat. No. 9,627,305.

(51) Int. Cl.
*H01L 23/04* (2006.01)
*H05K 1/18* (2006.01)
*H01L 25/10* (2006.01)

(52) U.S. Cl.
CPC ............. *H01L 23/04* (2013.01); *H01L 25/10* (2013.01); *H05K 1/181* (2013.01); *H01L 2224/01* (2013.01)

(58) Field of Classification Search
CPC .......... H01L 23/49811; H01L 23/3142; H01L 23/49541; H01L 23/49551;
(Continued)

(56) References Cited

U.S. PATENT DOCUMENTS 5,886,397 A   3/1999 Ewer et al.
5,973,388 A   10/1999 Chew et al.
(Continued)

FOREIGN PATENT DOCUMENTS

CN    1659698 A    8/2005
WO    2012120568 A1   9/2012

OTHER PUBLICATIONS

Adamson, Philip, "Lead-free Packaging for Discrete Power Semiconductors", 2002 JEDEC Conference, International Rectifier, Apr./May 2002. pp. 1-5.

*Primary Examiner* — John P Dulka
(74) *Attorney, Agent, or Firm* — Murphy, Bilak & Homiller, PLLC

(57) ABSTRACT

A semiconductor package includes a block having opposing first and second main surfaces and sides between the first and second main surfaces, and an encapsulation material at least partly covering the block. One or both of the main surfaces of the block has recessed regions. The recessed regions do not extend completely through the block from one main surface to the other main surface. The encapsulation material fills the recessed regions to form an interlocked connection between the block and the encapsulation material. Additional semiconductor package embodiments are provided.

6 Claims, 19 Drawing Sheets

(58) Field of Classification Search
CPC ............... H01L 23/49562; H01L 24/81; H01L 2924/35121; H01L 2924/181; H01L 23/3107; G06F 17/5068
See application file for complete search history.

(56) References Cited

U.S. PATENT DOCUMENTS

| | | | |
|---|---|---|---|
| 6,242,281 | B1 | 6/2001 | Mclellan et al. |
| 6,448,633 | B1 * | 9/2002 | Yee ..................... H01L 23/3107 257/666 |
| 6,501,158 | B1 * | 12/2002 | Fazelpour ......... H01L 23/49503 257/666 |
| 6,700,189 | B2 | 3/2004 | Shibata |
| 6,847,099 | B1 | 1/2005 | Bancod et al. |
| 7,042,068 | B2 | 5/2006 | Ahn et al. |
| 7,763,958 | B1 | 7/2010 | Lim et al. |
| 7,838,339 | B2 | 11/2010 | Tsui et al. |
| 7,838,974 | B2 | 11/2010 | Poddar et al. |
| 9,627,305 | B2 * | 4/2017 | Meyer-Berg ...... H01L 23/49541 |
| 2005/0179118 | A1 * | 8/2005 | Ng ..................... H01L 21/4842 257/666 |
| 2005/0263861 | A1 * | 12/2005 | Ahn ................. H01L 23/49503 257/666 |
| 2011/0062568 | A1 | 3/2011 | Galera et al. |
| 2012/0181676 | A1 | 7/2012 | Tsui et al. |
| 2012/0286412 | A1 | 11/2012 | Kimura et al. |
| 2013/0049181 | A1 | 2/2013 | Wen et al. |
| 2013/0070438 | A1 | 3/2013 | Choi et al. |
| 2013/0181351 | A1 | 7/2013 | Yang |
| 2013/0320496 | A1 | 12/2013 | Nishijima et al. |
| 2014/0264678 | A1 | 9/2014 | Liu et al. |

* cited by examiner

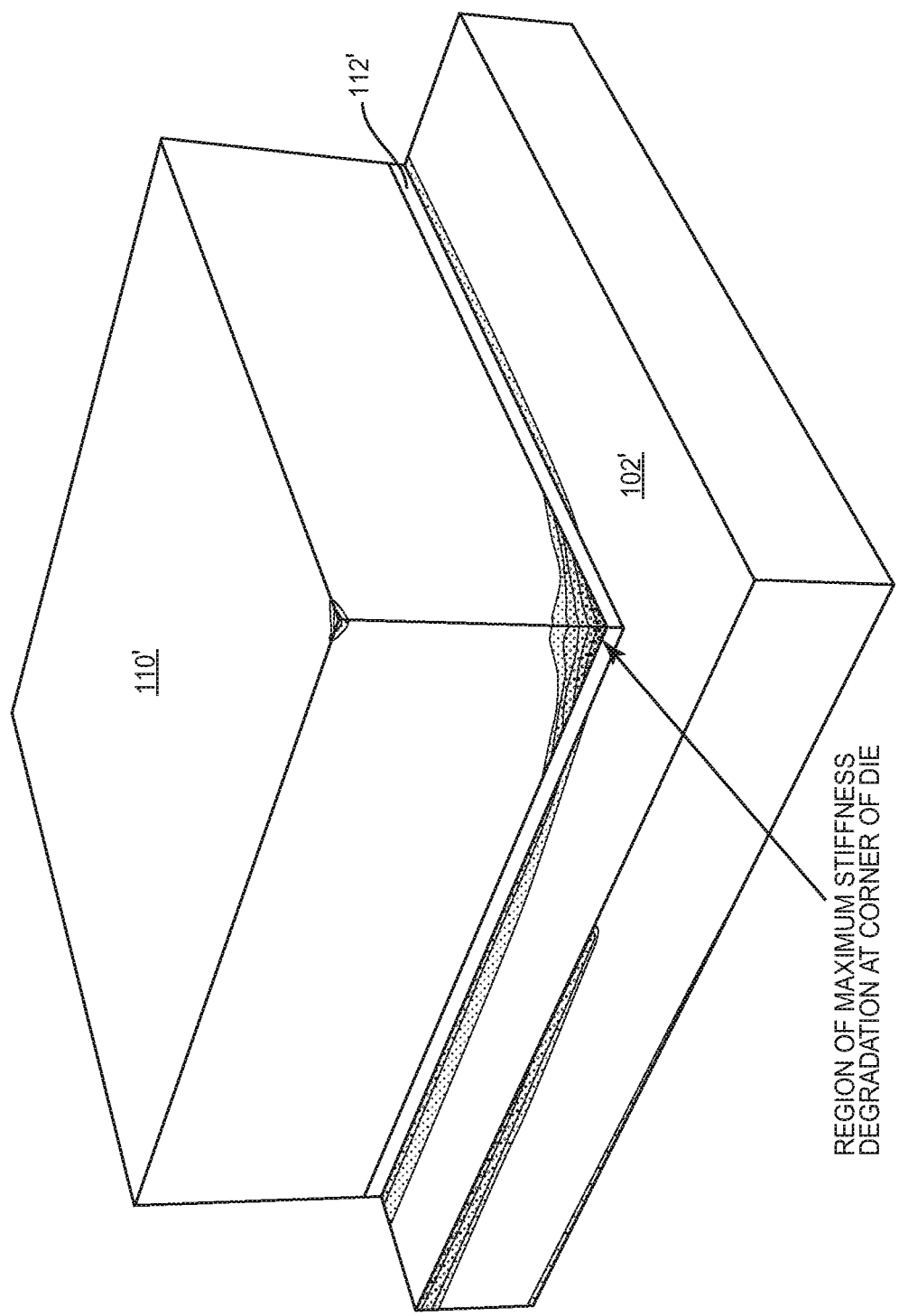

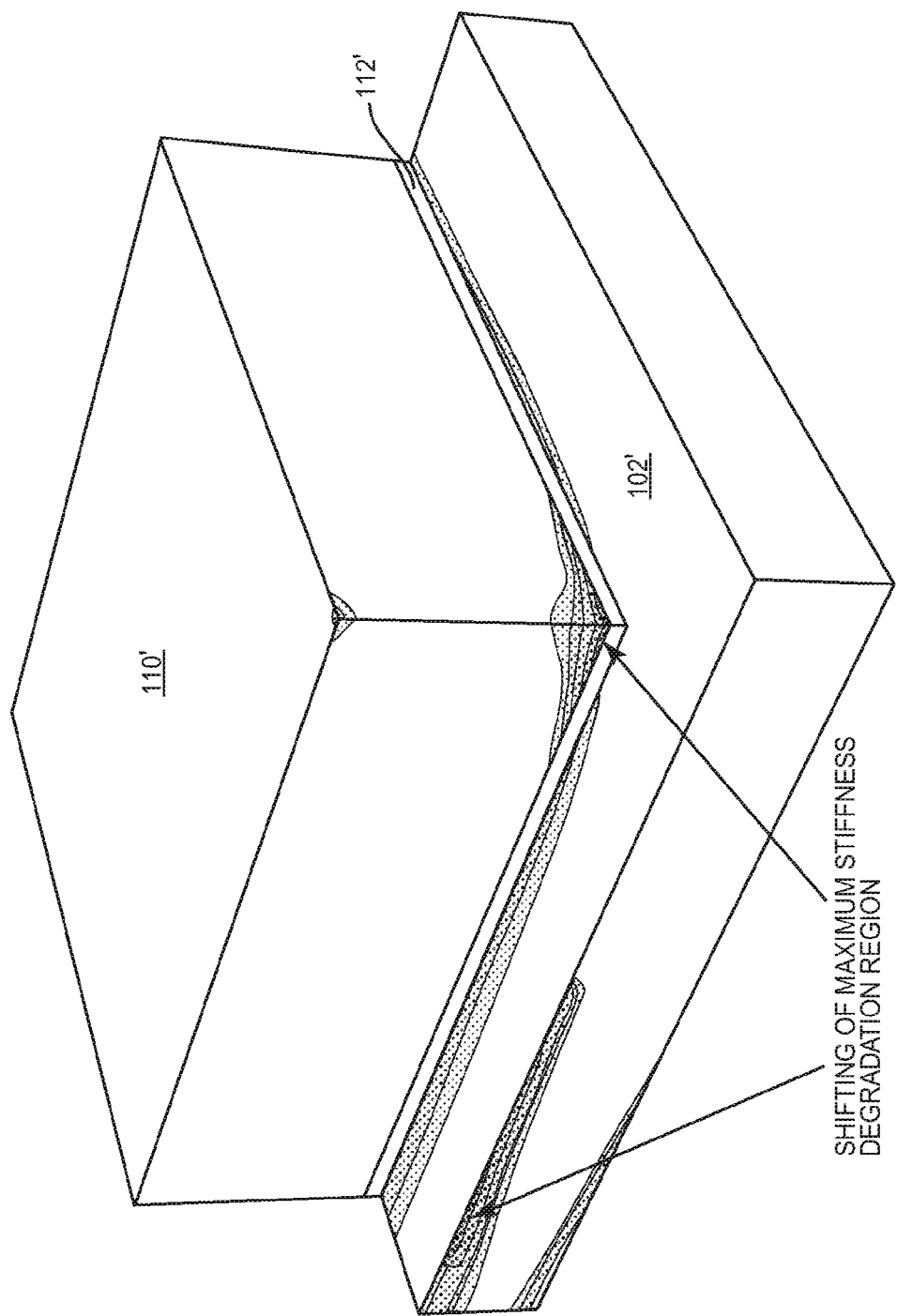

SEMICONDUCTOR PACKAGE WITH INTERLOCKED CONNECTION

TECHNICAL FIELD

The present application relates to semiconductor modules, in particular semiconductor modules with components having different coefficients of thermal expansion.

BACKGROUND

Semiconductor packages include various components such as semiconductor dies (chips), support substrates for the dies, leads, electrical connections, heat spreaders, etc. The components are typically covered by a molding compound. Semiconductor packages are rated for a certain temperature range, at the extremes of which delamination can occur between the molding compound and one or more of the package components. Delamination occurs due to the difference in thermal expansion coefficients of the different materials. For example, a copper block included in the package for supporting a die or spreading heat has a higher CTE (coefficient of thermal expansion) than the surrounding molding compound. Repeatedly cycling the temperature down to about −40° C. causes the molding compound to begin separating from the copper block along the interface between the molding compound and the copper block. The gap between the molding compound and the copper block resulting from the delamination provides an open pathway for humidity and other contaminants to reach the semiconductor die and other sensitive components included in the package, resulting in catastrophic failure. Delamination of the molding compound is conventionally addressed by roughening the surface of the components surrounded by the molding compound or using an adhesion promoter. These and other conventional solutions increase the package cost and prove to be ineffective at increasing the operating temperature range of the package by a meaningful amount especially towards lower temperatures.

SUMMARY

According to an embodiment of a semiconductor package, the package comprises a support substrate having opposing first and second main surfaces and sides between the first and second main surfaces, a semiconductor die attached to one of the main surfaces of the support substrate, and an encapsulation material at least partly covering the support substrate and the semiconductor die. A protrusion extends outward from a side of the support substrate and terminates in the encapsulation material. The protrusion forms an interlocked connection with the encapsulation material. The interlocked connection increases the tensile strength of the interface between the encapsulation material and the side of the support substrate with the protrusion.

According to an embodiment of a method of manufacturing a semiconductor package, the method comprises: providing a support substrate having opposing first and second main surfaces and sides between the first and second main surfaces; forming a protrusion extending outward from a side of the support substrate; attaching a semiconductor die to one of the main surfaces of the support substrate; and at least partly covering the support substrate and the semiconductor die with an encapsulation so that the protrusion terminates in the encapsulation material and forms an interlocked connection with the encapsulation material. The interlocked connection increases the tensile strength of the interface between the encapsulation material and the side of the support substrate with the protrusion.

According to another embodiment of a semiconductor package, the package comprises a block having opposing first and second main surfaces and sides between the first and second main surfaces and an encapsulation material at least partly covering the block. A protrusion extends outward from a side of the block and terminates in the encapsulation material. A first side of the protrusion has a negative slope with respect to the side of the block and a second side of the protrusion has a positive slope with respect to the side of the block. The protrusion forms an interlocked connection with the encapsulation material. The interlocked connection increases the tensile strength of the interface between the encapsulation material and the side of the block with the protrusion.

According to an embodiment of a method of designing a semiconductor package comprising a block and an encapsulation material at least partly covering the block, the method comprises: simulating delamination along an interface between the block and the encapsulation material, the simulation identifying a location of the interface where the encapsulation material is expected to first separate from the block at temperatures below 0° C.; and adding a protrusion to the package design that extends outward from the block at the location of the interface where the encapsulation material is expected to first separate from the block, the protrusion forming an interlocked connection with the encapsulation material. The interlocked connection is designed to increase the tensile strength of the interface between the encapsulation material and a side of the block with the protrusion.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 5C illustrate the maximum stiffness degradation profile for various interfaces within a conventional semiconductor package at different temperatures.

DETAILED DESCRIPTION

The embodiments described herein provide an interlocked connection between one or more blocks included in a semiconductor package and an encapsulation material that at least partly covers the blocks. Each interlocked connection increases the tensile strength of the interface with the encapsulation material in the region of the interlocked connection, making it more difficult for the encapsulation material to separate or pull apart (i.e. delaminate) from the block with the interlocked connection. The interlocked connections can be strategically provided at delamination weak points within the package, allowing the package to be operated at a wider temperature range without incurring delamination-type failures.

Figure 1:
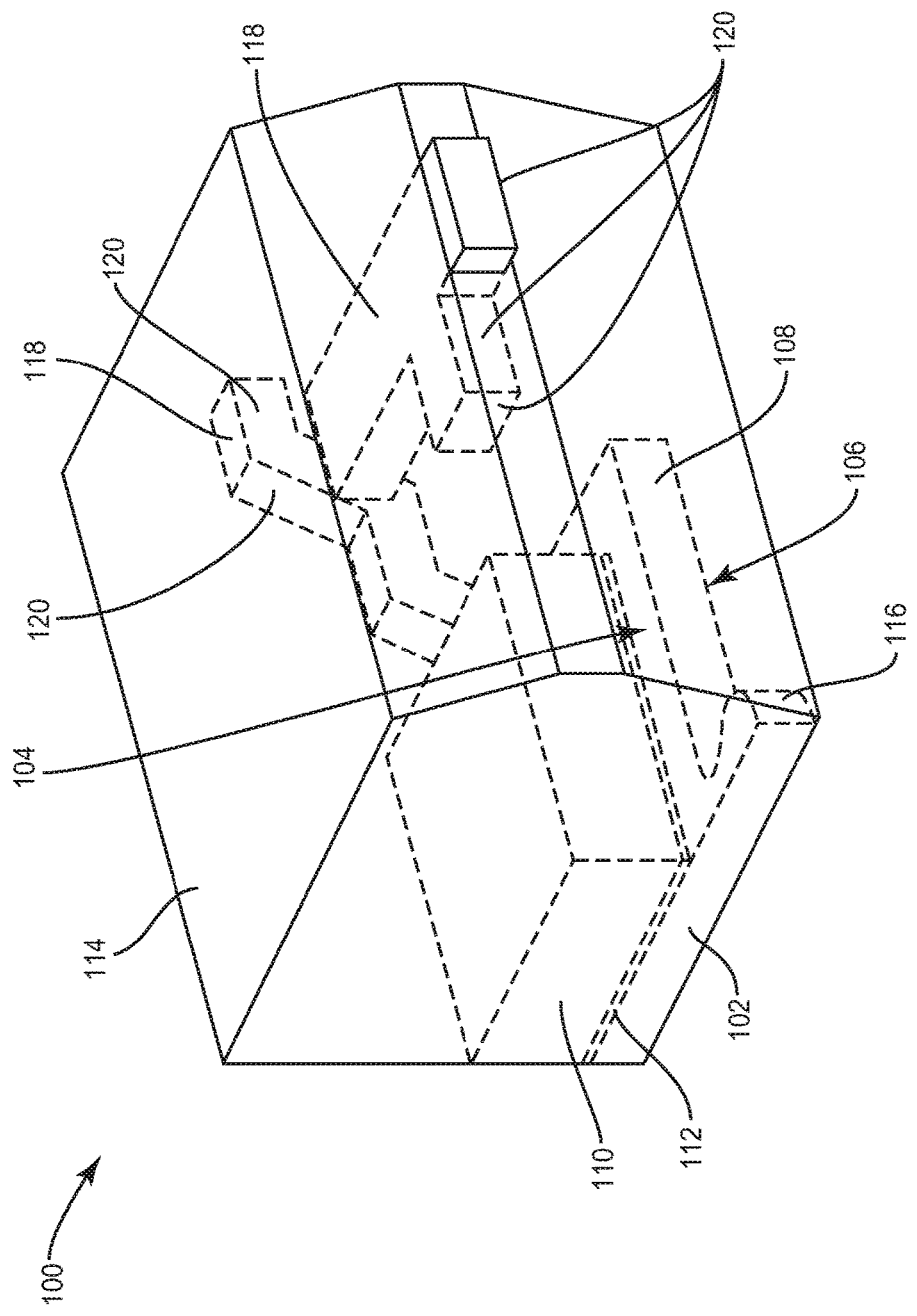
FIG. 1 illustrates a partial side perspective view of an embodiment of a semiconductor package with an interlocked connection.
Figure 2:
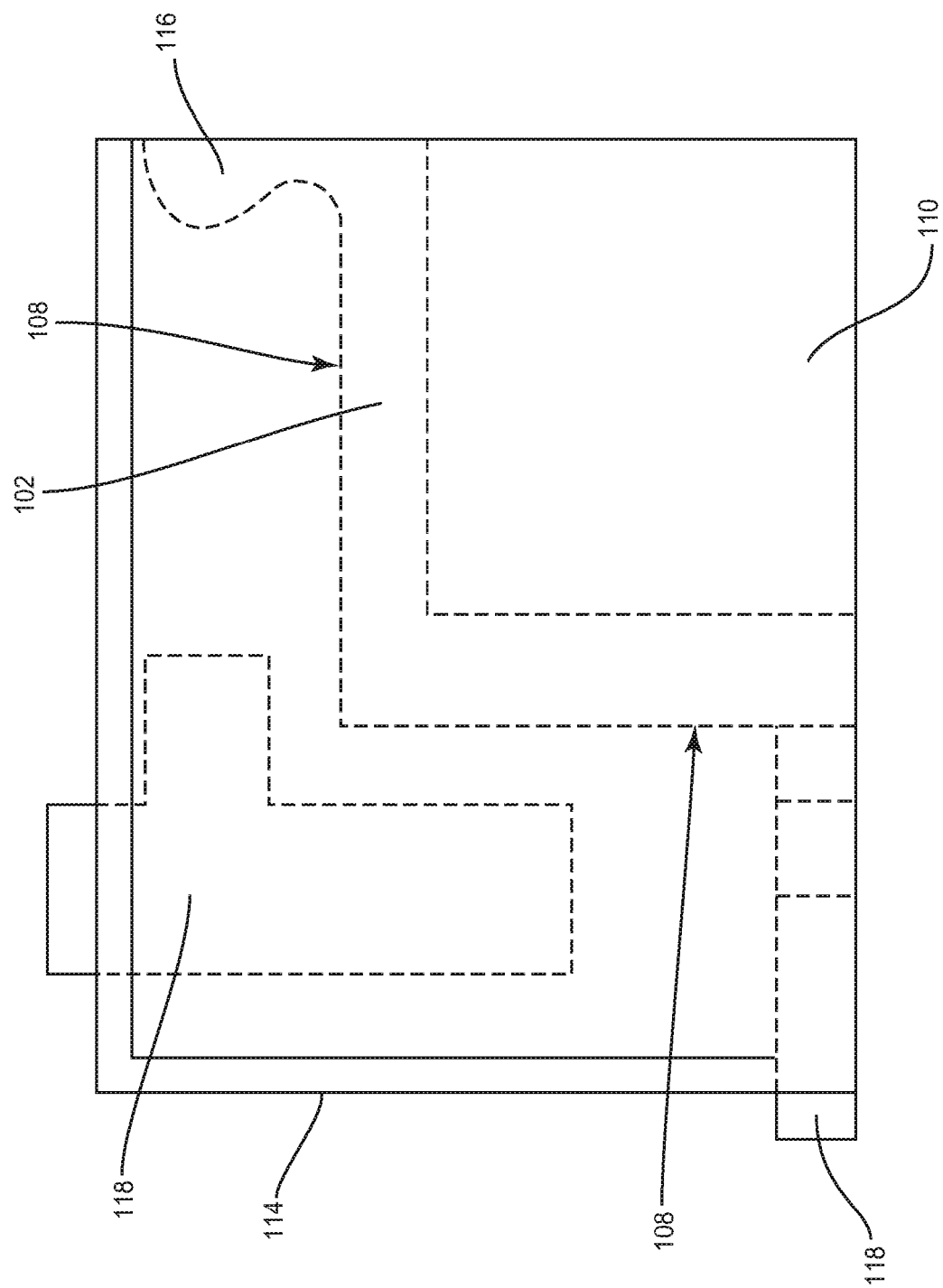
FIG. 2 illustrates a partial top plan view of the semiconductor package of FIG. 1.

FIG. 1 illustrates a side perspective view of part of a semiconductor package 100 and FIG. 2 illustrates a corresponding top plan view of the package 100 according to an embodiment. The package 100 comprises a support substrate 102 having opposing first and second main surfaces 104, 106 and sides 108 between the first and second main surfaces 104, 106. A semiconductor die 110 is attached to one of the main surfaces 104, 106 of the support substrate 102 by a joining layer 112 such as solder. The joining layer 112 can be a single layer or include multiple sublayers. The support substrate 102 can be a metal block such as a copper block, a spacer, a ceramic with metallized sides, a die paddle of a lead frame, etc. Any type of semiconductor die 110 can be attached to the support substrate 102 such as a transistor die, diode die, passive die, etc. The die 110 can be fabricated in any type of semiconductor technology such as Si, SiC, GaAs, GaN, etc. More than one die 110 can be attached to the support substrate 102. In each case, an encapsulation material 114 at least partly covers the support substrate 102 and the semiconductor die 110. Any suitable encapsulation material 114 can be employed such as an epoxy, molding compound, etc.

A protrusion 116 extends outward from a side 108 of the support substrate 102 and terminates in the encapsulation material 114. In the embodiment shown in FIGS. 1 and 2, at least part of the bottom surface 106 of the support substrate 102 is exposed i.e. uncovered by the encapsulation material 114 to provide an external electrical connection and/or dissipate heat. Part of or all of the bottom surface of the protrusion 116 can also be uncovered by the encapsulation material 114.

Regardless, the protrusion 116 forms an interlocked connection with the encapsulation material 114 i.e. the protrusion 116 is locked together or interconnected with the encapsulation material 114 e.g., after curing of a molding compound encapsulation material 114. The interlocked connection increases the tensile strength of the interface between the encapsulation material 114 and the side 108 of the support substrate 102 with the protrusion 115, making it more difficult for the encapsulation material 114 to delaminate from the support substrate 102 in this region of the package 100. The protrusion 116 can extend outward from the side 108 of the support substrate 102 in the same plane as the support substrate 102 as shown in FIG. 1. Alternatively, the protrusion 116 can extend in a different plane i.e. intersect the plane in which the support substrate 102 extends. In one embodiment, the support substrate 102 is a metal block and the protrusion 116 is a single continuous part of the metal block.

Broadly, the protrusion 116 can be a single continuous part of the support substrate 102 or attached to the substrate 102 e.g. by soldering, brazing, gluing, etc. More than one protrusion 116 can be provided at the same or different sides 108 of the support substrate 102. The package 100 also includes leads 118 which protrude through the encapsulation material 114 to provide external electrical connections for the package 100. One or more of the leads 118 can also have a protrusion 116 at one or more sides 120 of the lead 118 which is designed to form an interlocked connection with the surrounding encapsulation material 114. Placement of the protrusions 116 within the package 100 can be determined during the package design process.

Figure 3:
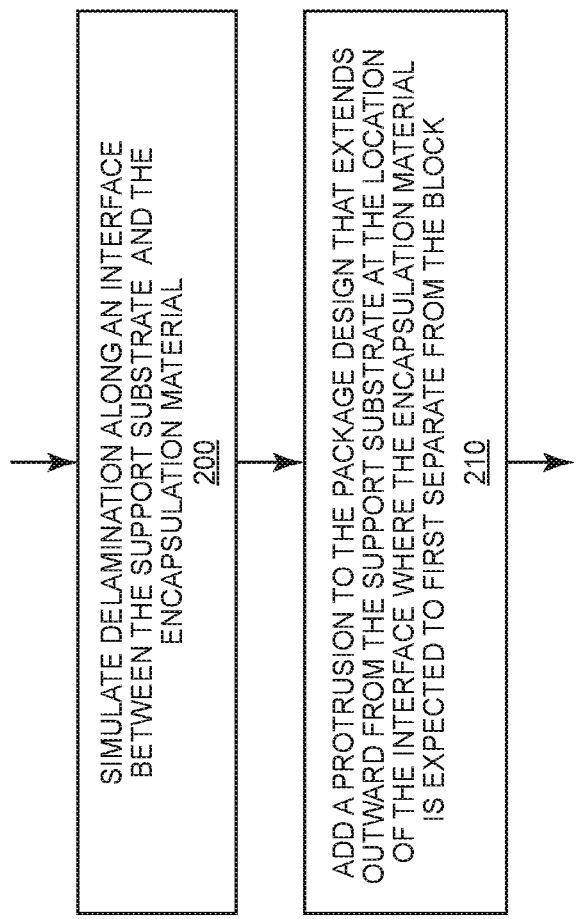
FIG. 3 illustrates a diagram of an embodiment of a method of designing a semiconductor package with an interlocked connection.

FIG. 3 illustrates a flow diagram of an embodiment of a method of designing a semiconductor package comprising a block such as the support substrate 102 shown in FIGS. 1 and 2 and an encapsulation material at least partly covering the block. The method comprises simulating delamination along an interface between the block and the encapsulation material (Block 200).

As part of the simulation process, various manufacturing and use assumptions are processed by the simulation model such as material deposition and cure temperatures, specified maximum and minimum use temperatures, loading conditions such as normal and shear loads, surface energies, fracture toughness, etc. The simulation model determines a function such as a thermal cycling environment (decay function) or a linearized cooling function for the package under design based on the various assumptions input to the model. Behavior of the package under design is then modeled based on the function constructed by the simulation model. The simulation model identifies a location of the interface where the encapsulation material is expected to first separate from the block at temperatures below 0° C.

(result of Block 200). This location is also referred to herein as delamination initiation region.

The method further comprises adding a protrusion to the package design that extends outward from the block at the location of the interface where the encapsulation material is expected to first separate from the block (Block 210). More than one protrusion can be added to the design depending on the number and severity of the delamination initiation regions identified by the simulation model. Each protrusion is designed to form an interlocked connection with the surrounding encapsulation material that increases the tensile strength of the interface between the encapsulation material and the side of the block with the protrusion.

Figure 4:
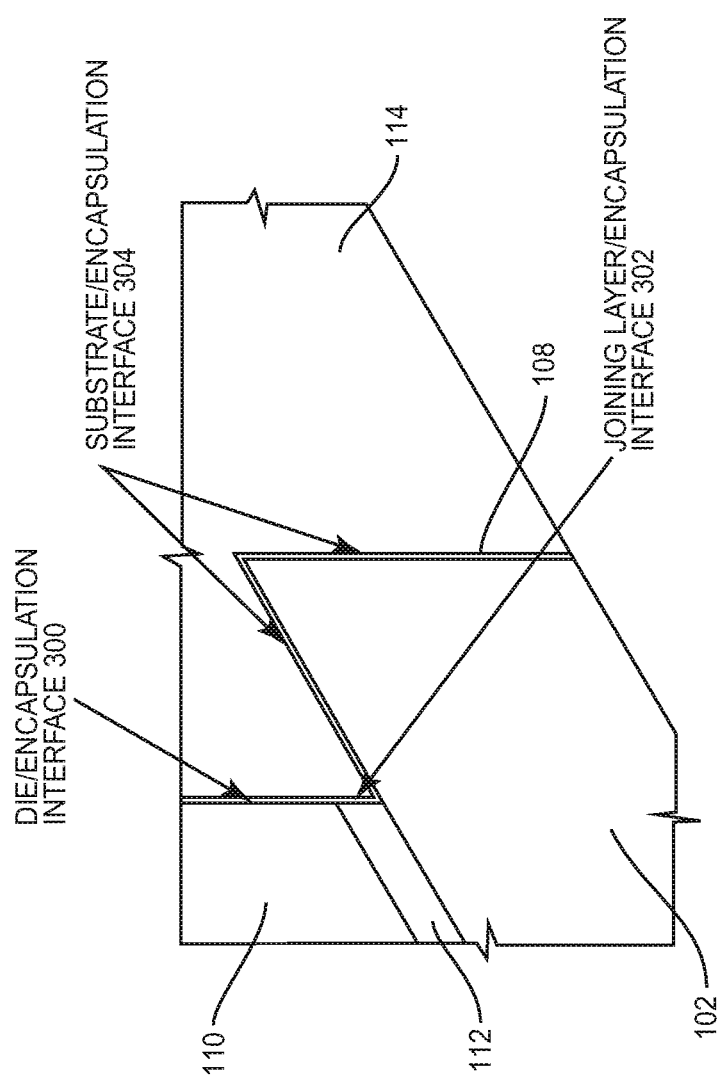
FIG. 4 illustrates a partial view of various interfaces within the package evaluated for delamination by the package design method of FIG. 3.

FIG. 4 illustrates part of a semiconductor package 100 designed in accordance with the method of FIG. 3. In FIG. 4, the interfaces under consideration are shown. Delamination at the interface 300 between the encapsulation material 114 and the semiconductor dies 110, at the interface 302 between the encapsulation material 114 and the die joining layer 112, and at the interface 304 between the encapsulation material 114 and the sides 108 of the die support substrates 102 are studied. For a typical molding compound and a typical metal block such as a heat spreader, die support substrate, lead, etc., the CTE mismatch can be significant with regard to delamination at low temperatures of about −40° C. For example, copper metal blocks have a CTE of about 16-18 and typical molding compounds have a CTE of about 9-12. At temperatures of about −40° C., significant delamination can begin occurring along these interfaces. At even lower temperatures the delamination worsens and results in an open gap which provides a pathway for humidity and other contaminants to reach the critical components of the package 100 such as the dies 110 and interconnects (not shown), which can cause catastrophic failure.

Figure 5C:
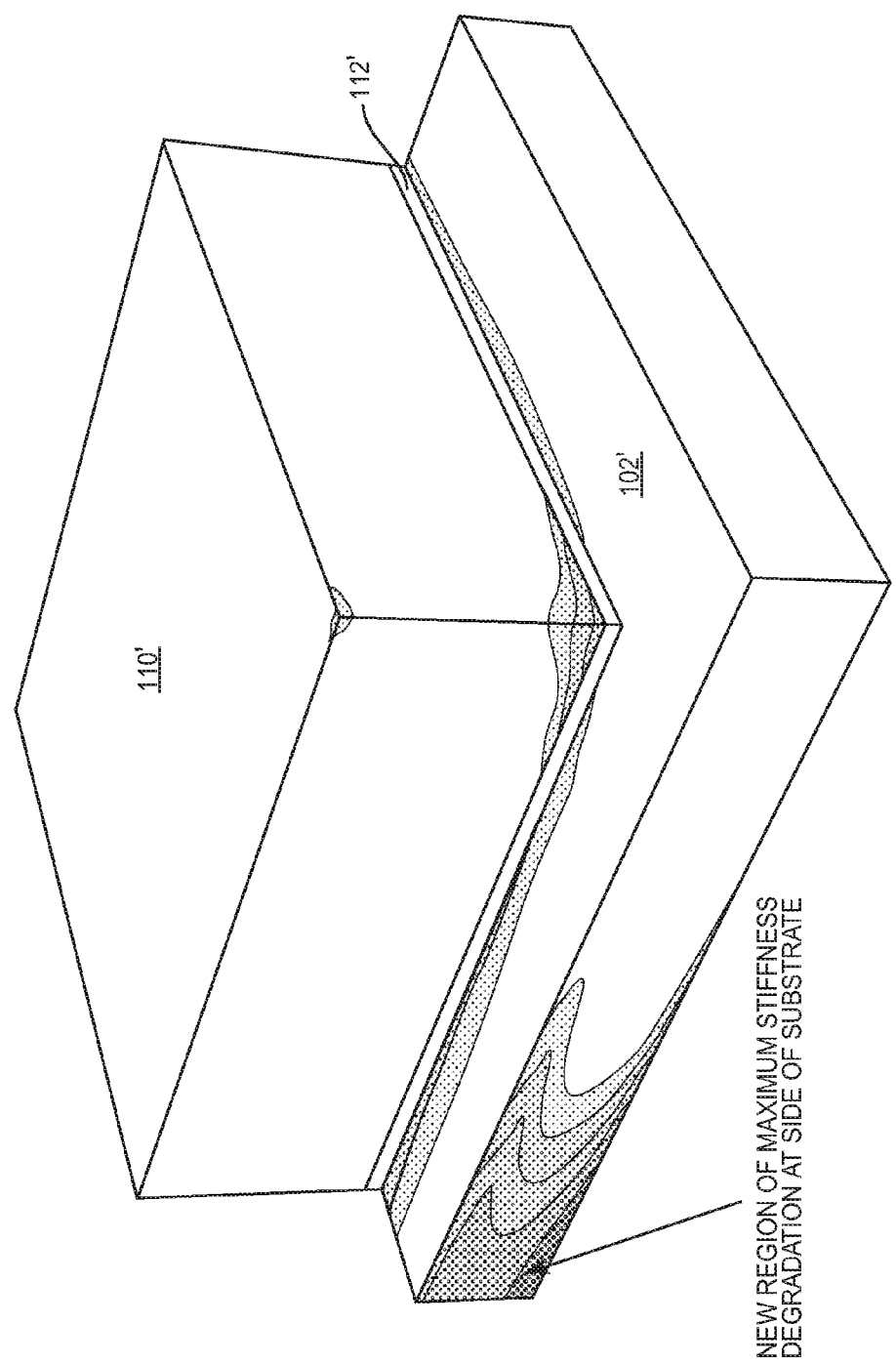

FIGS. 5A through 5C illustrate scalar stiffness degradation at the interfaces between an encapsulation material (not shown in FIGS. 5A through 5C for ease of illustration) and a conventional encapsulated die 110', support substrate and joining layer 112' for decreasingly lower temperatures. FIG. 5A shows a region of maximum stiffness degradation at the lower corner of the die and a region of lesser stiffness degradation along the side of the support substrate, at −45.1° C. The stiffness degradation regions of concern are illustrated with gradients in FIGS. 5A through 5C, where the darker/more dense gradients correspond to greater stiffness degradation and lighter/less dense gradients correspond to lower stiffness degradation. As the stiffness degrades, the integrity of the interface with the encapsulation material decreases and delamination can occur. FIG. 5B shows a further decrease in stiffness along the side of the support substrate as the temperature decreases to −47.39° C. FIG. 5C represents a minute temperature decrease to −47.4° C., which results in the region of maximum stiffness degradation shifting from the lower corner of the die to along the side of the support substrate. The interface between the support substrate and the encapsulation material becomes compromised in this region of the package, as the encapsulation material separates or pulls away from the side of the support substrate.

Figure 6:
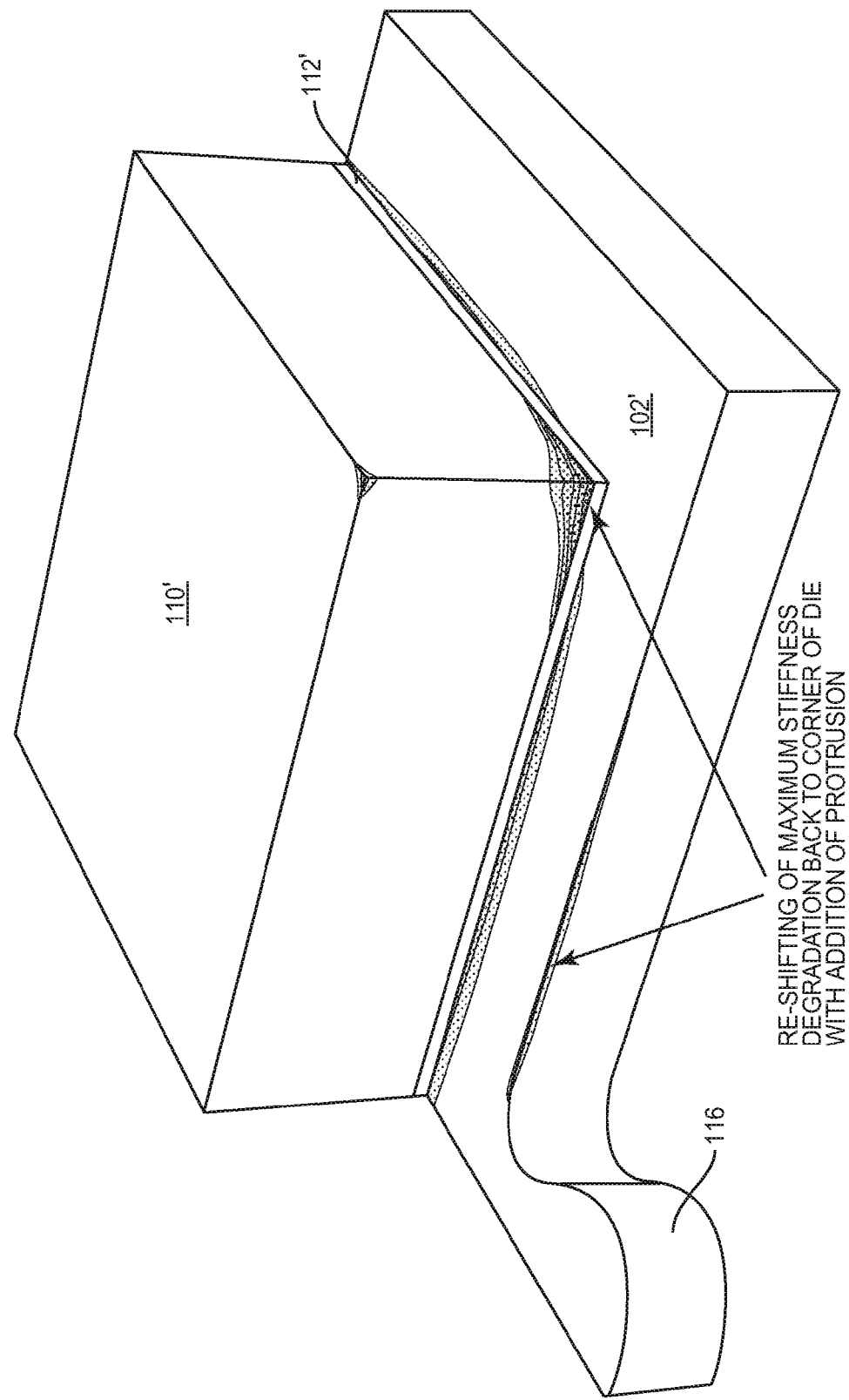
FIG. 6 illustrates the maximum stiffness degradation profile for the conventional semiconductor package of FIGS. 5A through 5C after addition of a protrusion along the side of a substrate included in the package.

FIG. 6 shows the same encapsulated die 110', support substrate 102' and joining layer 112' as shown in FIG. 5C at −47.4° C. (i.e. at the critical temperature where the interface failed along the side of the support substrate for the conventional package), after modification by the package design method described herein to include a protrusion 116 placed along the side of the support substrate 102' at the region of maximum stiffness degradation. That is, the simulation model places a protrusion 116 at the interface between the side of the support substrate 102' and the encapsulation material where the interface is expected to first fail. As shown in FIG. 6, delamination is no longer expected to occur at −47.4° C. in this previously problematic region of the package. Simulation results show this interface region to remain reliable at even lower temperatures.

Figure 7:
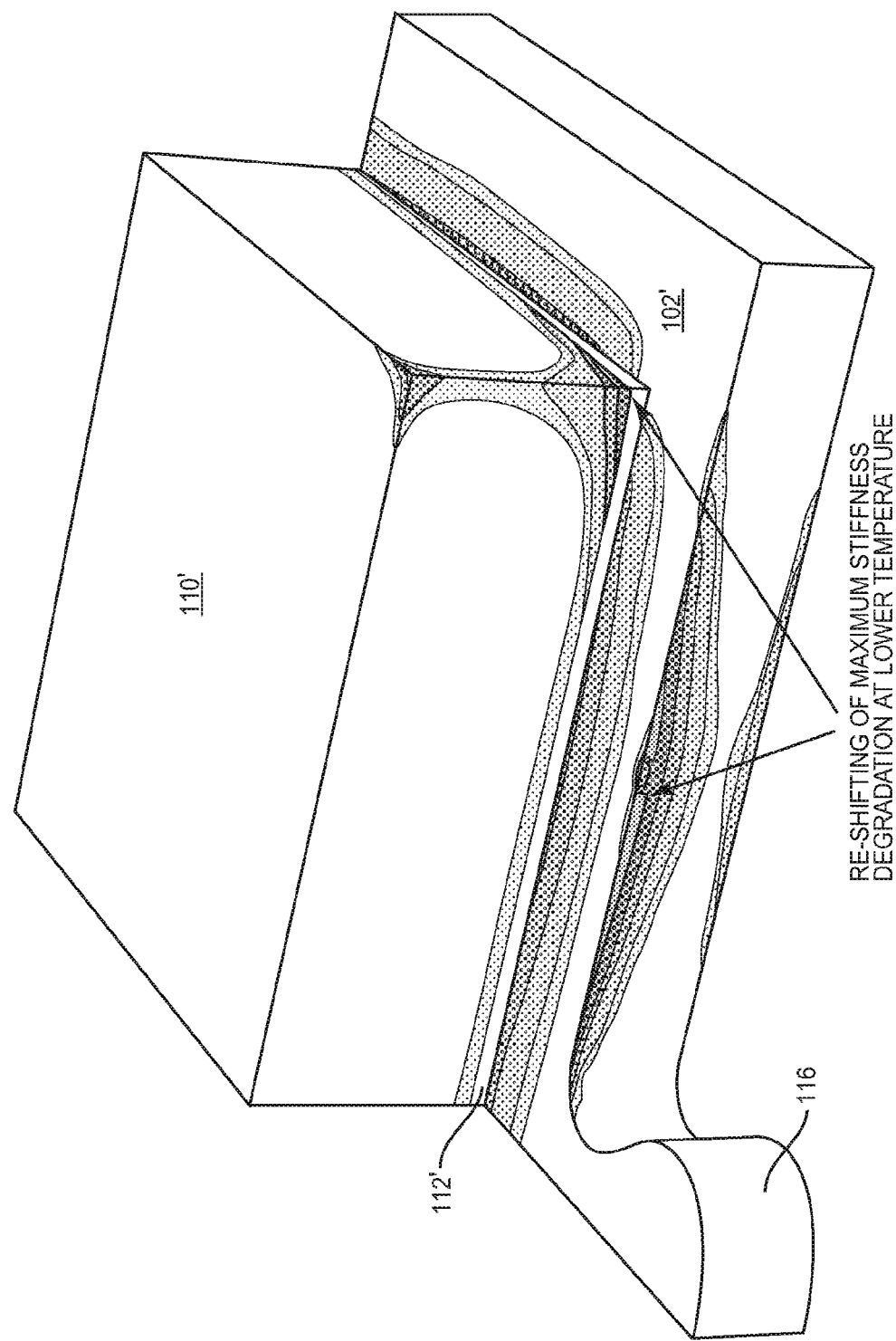
FIG. 7 illustrates the maximum stiffness degradation profile for the semiconductor package of FIG. 6 at an even lower temperature.

FIG. 7 shows the encapsulated die 110', support substrate 102' and joining layer 112' of FIG. 6 with one added protrusion 116 and at −56.15° C. The interface between the encapsulation material and the protrusion 116 extending from the side of the support substrate 102' remains intact at this lower temperature. However, the region of maximum stiffness degradation shifts from the lower corner of the die to another region along the same side of the support substrate 102' with the protrusion 116. The simulation model can modify the package design again to include another protrusion 116 placed at this new region of expected delamination.

Figure 8:
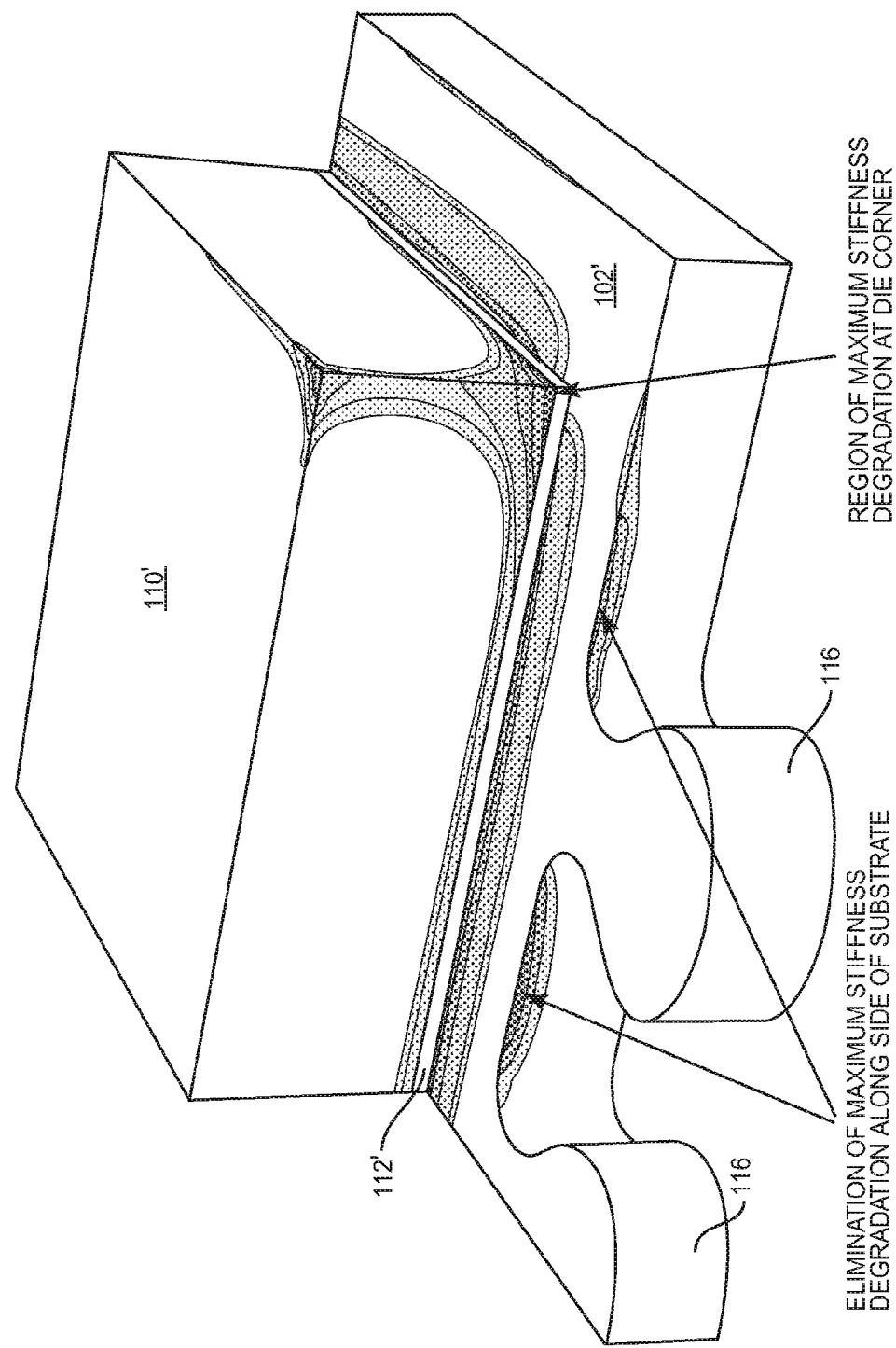
FIG. 8 illustrates the maximum stiffness degradation profile for the semiconductor package of FIGS. 6 and 7 after addition of another protrusion along the side of the package substrate.

FIG. 8 shows the encapsulated die 110', support substrate 102' and joining layer 112' of FIG. 7 with an additional protrusion 116 strategically placed along the same side of the support substrate 102' as the first protrusion 116 to avoid significant delamination of the encapsulation material from this side of the support substrate 102'. The simulation results illustrated in FIG. 8 are at −65° C. Broadly, the simulation method described herein can identify various locations along any blocks included in a semiconductor package and place protrusions which form an interlocked connection with the encapsulation material to increase the tensile strength of the interface between the encapsulation material of the package and the blocks of the package.

Figure 9:
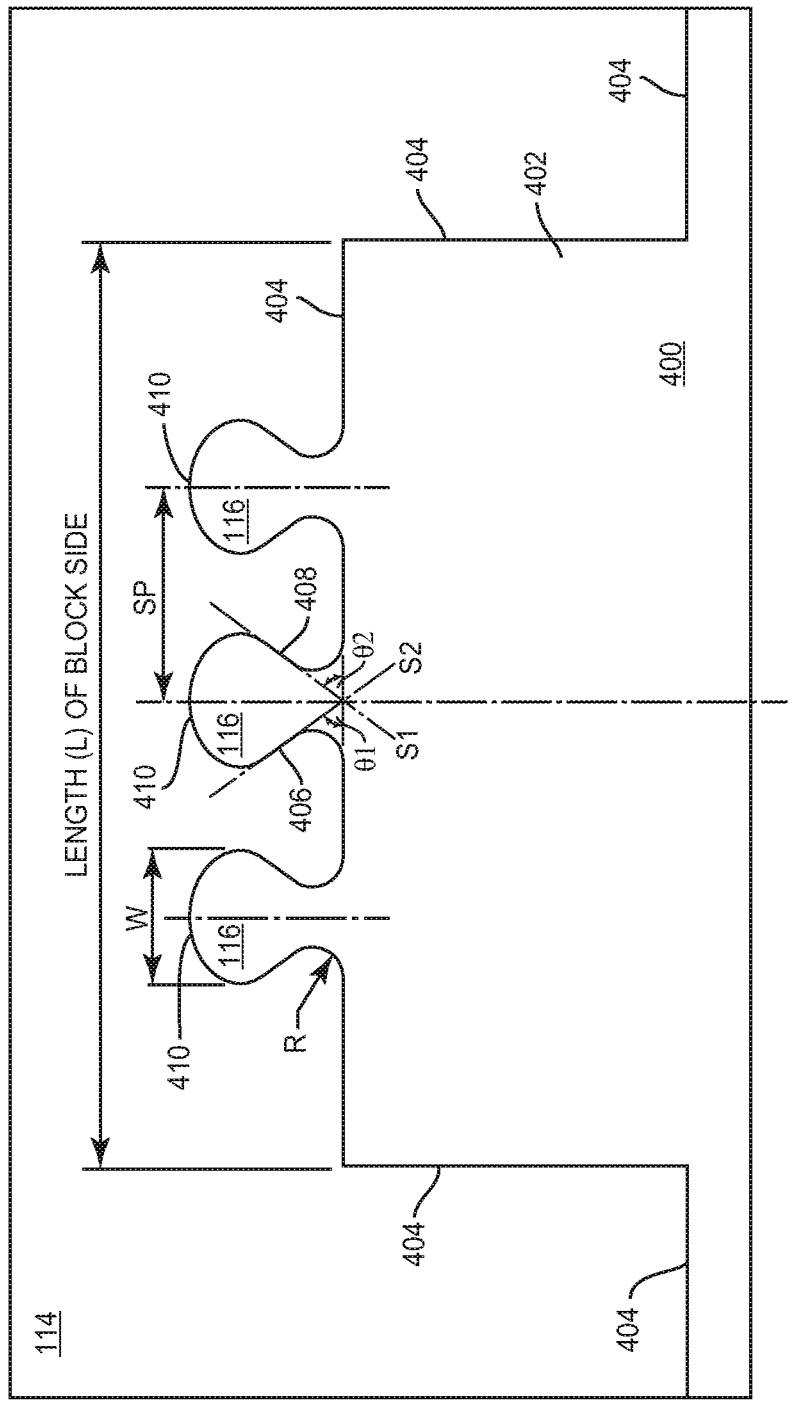
FIG. 9 illustrates a partial sectional view of an embodiment of a block with a plurality of protrusions that form interlocked connections within a semiconductor package.

FIG. 9 illustrates a partial sectional view of another embodiment of a block 400 included in a semiconductor package. The block 400 can be a metal block such as a copper block, a spacer, a ceramic with metallized sides, a die paddle of a lead frame, etc. The block 400 has a first main surface 402 and an opposing second surface which is out of view in FIG. 9, and sides 404 between the first and second main surfaces. An encapsulation material 114 at least partly covers the block 400. A plurality of protrusions 116 extend outward from a side 404 of the block 400 and terminate in the encapsulation material 114.

In the case of the block 400 being an electrical lead, the lead 400 can protrude out of the encapsulation material 114 to provide an external electrical connection for the package. In this case, the lead 400 has a first part covered by the encapsulation material 114 as shown in FIG. 9 and a second part (out of view in FIG. 9) uncovered by the encapsulation material 114. The protrusions 116 extend from the part of the lead 400 covered by the encapsulation material 114.

In the embodiment shown in FIG. 9, a first side 406 of each protrusion 116 has a negative slope (s1) with respect to the side 404 of the block 400 with the protrusion 116. A second side 408 of the protrusion 116 has a positive slope (s2) with respect to the same side 404 of the block 400. That is the first and second sides 406, 408 of each protrusion 116 extend outward from the side 404 of the block 400 at an angle (θ1, θ2) less than 90° C. One or more of the protrusions 116 can have a rounded distal end 410. Each protrusion 116 forms an interlocked connection with the encapsulation material 114 which increases the tensile strength of the interface between the encapsulation material 114 and the side 404 of the block 400 with the protrusion 116.

In one embodiment, the interlocked connection between the encapsulation material 114 and each protrusion 116 is a dovetail joint. According to this embodiment, the protrusion 116 forms the tenon of the dovetail joint and the region of the encapsulation material 114 adjacent the protrusion 116 forms the mortise of the dovetail joint. For example, each protrusion 116 can flare outward from a side 404 of the block 400 as shown in FIG. 9 and is surrounded by the encapsulation material 114 to form an interlocked joint between the protrusion 116 and the encapsulation material 114. The protrusions 116 can have the same or different dimensions such as radius (R) of curvature, width (W) and spacing (SP). The protrusions 116 can be uniformly or non-uniformly spaced along the sides 404 of the blocks 400.

Figure 10:
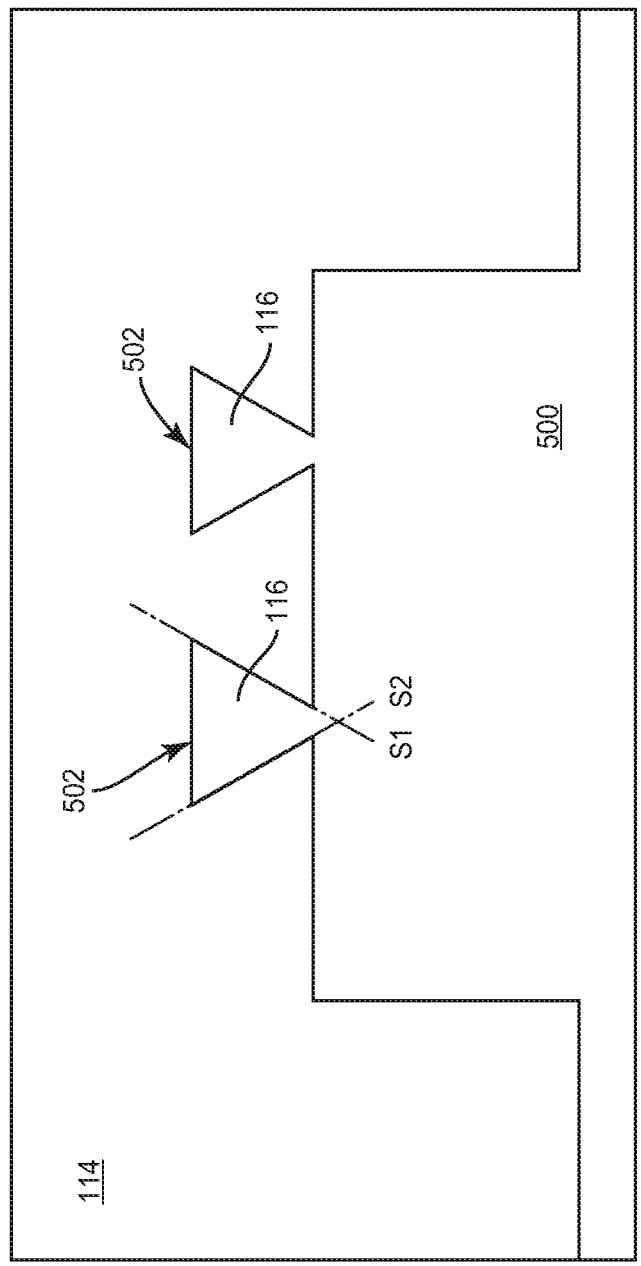
FIG. 10 illustrates a partial sectional view of another embodiment of a block with a plurality of protrusions that form interlocked connections within a semiconductor package.

FIG. 10 illustrates another embodiment of a block 500 included in a semiconductor package. The embodiment shown in FIG. 10 is similar to the one shown in FIG. 9, however the protrusions 116 have a planar or flat distal end 502 instead of a rounded distal end.

Figure 11:
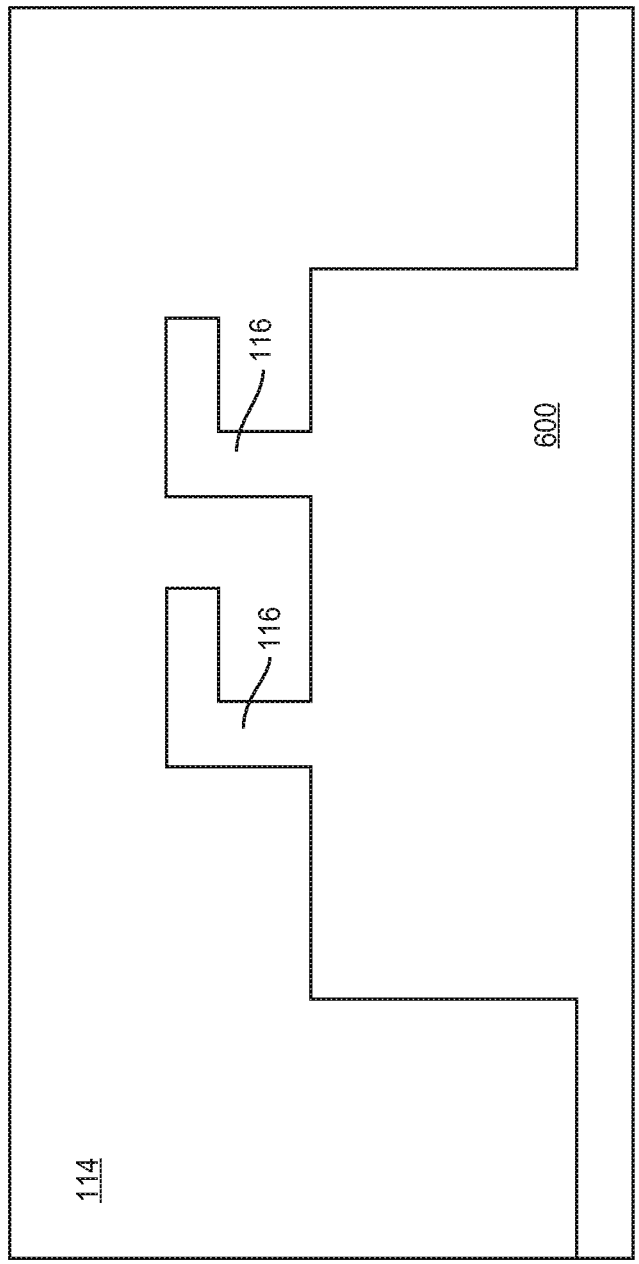
FIG. 11 illustrates a partial sectional view of yet another embodiment of a block with a plurality of protrusions that form interlocked connections within a semiconductor package.

FIG. 11 illustrates yet another embodiment of a block 600 included in a semiconductor package. The embodiment shown in FIG. 11 is similar to the one shown in FIG. 9, however the protrusions 116 are L-shaped.

Figure 12:
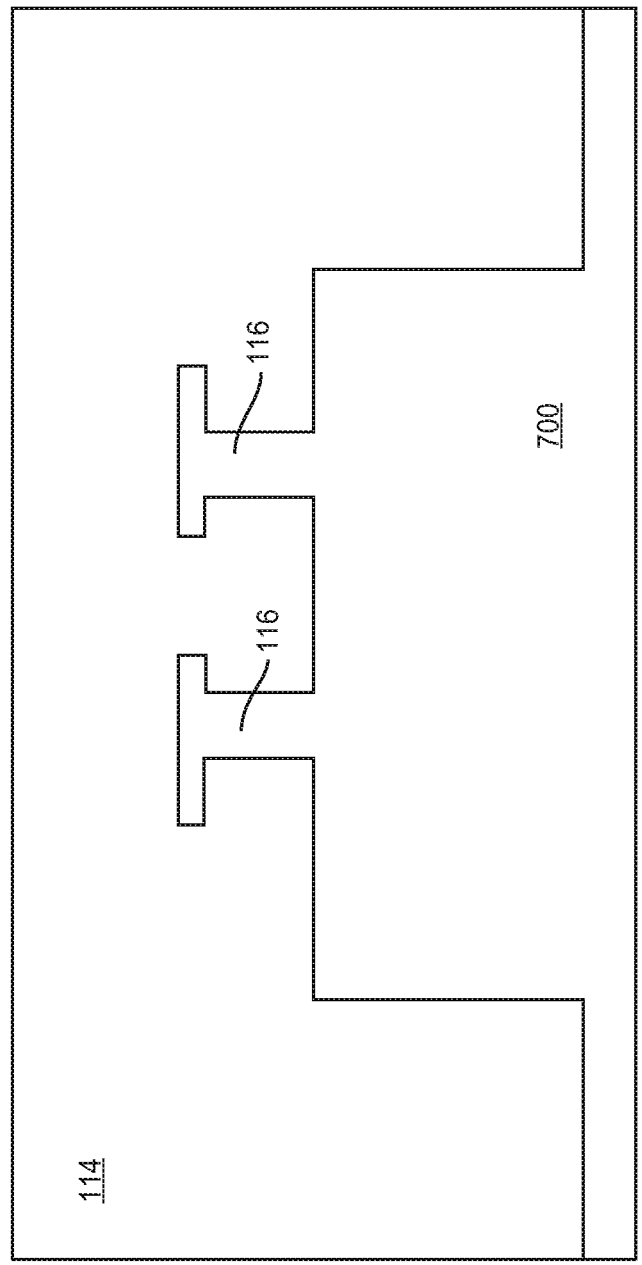
FIG. 12 illustrates a partial sectional view of still another embodiment of a block with a plurality of protrusions that form interlocked connections within a semiconductor package.

FIG. 12 illustrates still another embodiment of a block 700 included in a semiconductor package. The embodiment shown in FIG. 12 is similar to the one shown in FIG. 11, however the protrusions 116 are T-shaped instead of L-shaped.

Figure 13:
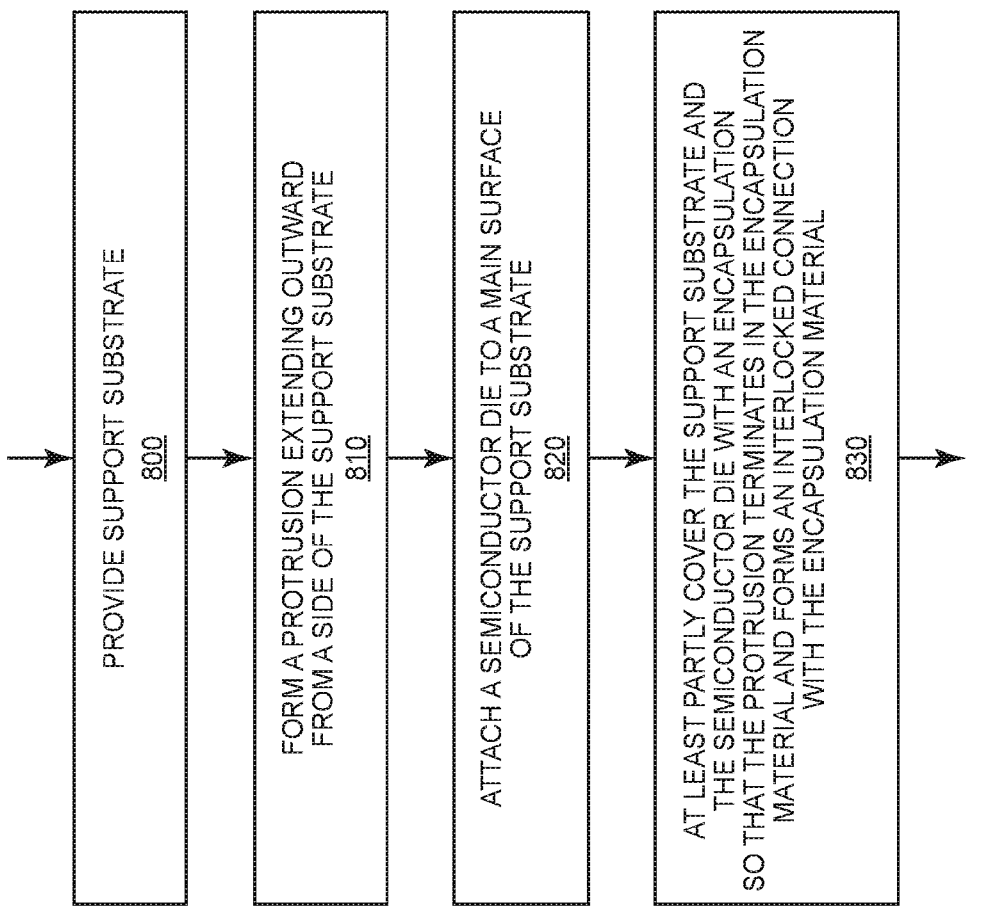
FIG. 13 illustrates a diagram of an embodiment of a method of manufacturing a semiconductor package with an interlocked connection.

FIG. 13 illustrates a flow diagram of an embodiment of a method of manufacturing a semiconductor package. The method comprises: providing a support substrate having opposing first and second main surfaces and sides between the first and second main surfaces (Block 800); forming a protrusion extending outward from a side of the support substrate (Block 810); attaching a semiconductor die to one of the main surfaces of the support substrate (Block 820); and at least partly covering the support substrate and the semiconductor die with an encapsulation so that the protrusion terminates in the encapsulation material and forms an interlocked connection with the encapsulation material which increases the tensile strength of the interface between the encapsulation material and the side of the support substrate with the protrusion (Block 830). The protrusion can be formed by chemical etching or stamping of the support substrate e.g. so that a first side of the protrusion has a negative slope and a second side of the protrusion has a positive slope as previously described herein. In practice both stamping and etching deliver edges with a certain radius, which for etching is minimal given the thickness of the metal leadframe.

The embodiments described above provide protrusion(s) along one or more sides of a block included in a semiconductor package to form an interlocked connection between the block and an encapsulation material that at least partly covers the blocks. Alternatively or in addition, other surface features can be provided to form or strengthen the interlocked connection.

Figure 14:
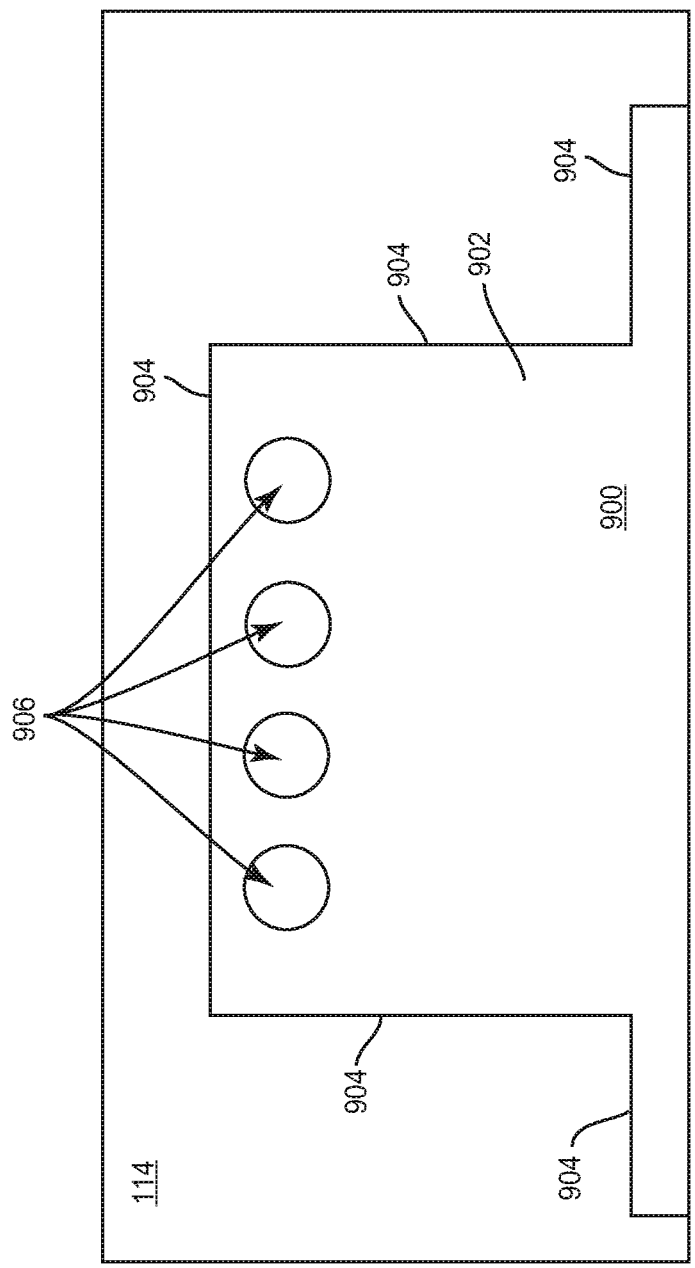
FIG. 14 illustrates a partial sectional view of an embodiment of a block with openings that form interlocked connections within a semiconductor package.

FIG. 14 illustrates a partial sectional view of another embodiment of a block 900 included in a semiconductor package. The block 900 can be a metal block such as a copper block, a spacer, a ceramic with metallized sides, a die paddle of a lead frame, etc. The block 900 has a first main surface 902 and an opposing second surface which is out of view in FIG. 14, and sides 904 between the first and second main surfaces. An encapsulation material 114 at least partly covers the block 900. A plurality of openings 906 extend through the block 900 from one main surface to the other main surface. The encapsulation material 114 fills the openings 906, forming an interlocked connection between the block 900 and the encapsulation material 114.

Figure 15:
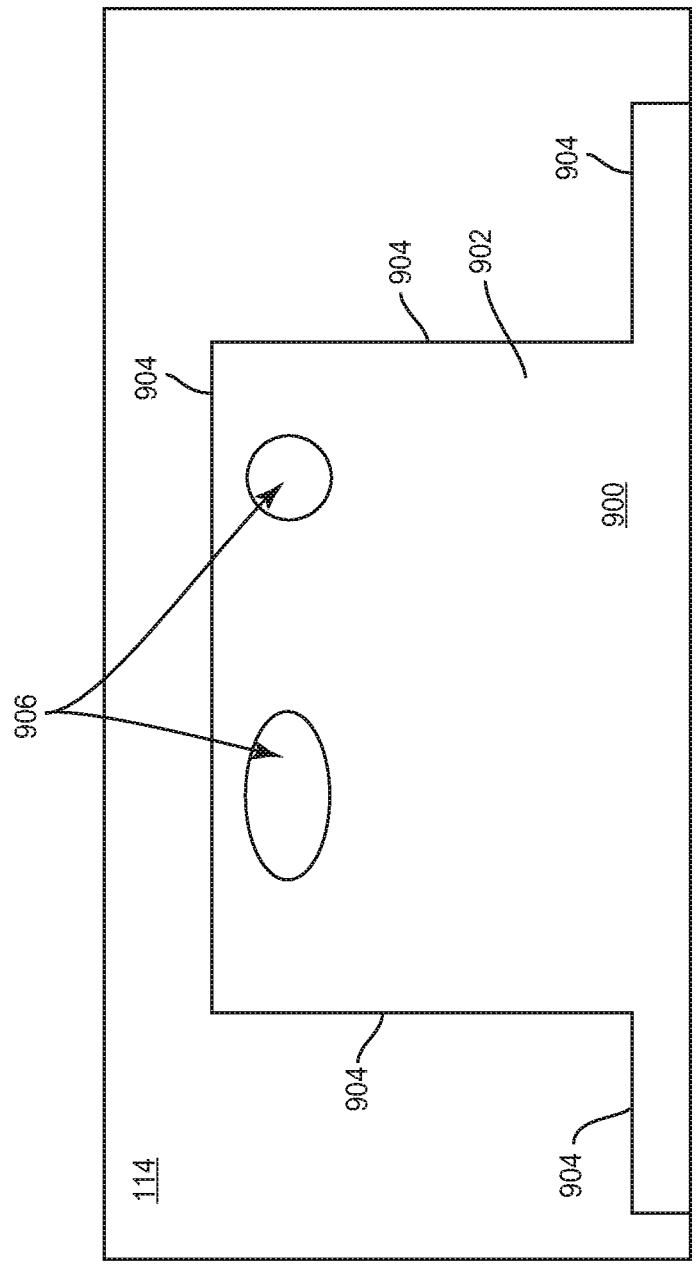
FIG. 15 illustrates a partial sectional view of another embodiment of a block with openings that form interlocked connections within a semiconductor package.

FIG. 15 illustrates another embodiment of the block 900. The embodiment shown in FIG. 15 is similar to the one shown in FIG. 14, however at least one of the openings 906 has an elliptical shape instead of a circular shape.

Figure 16:
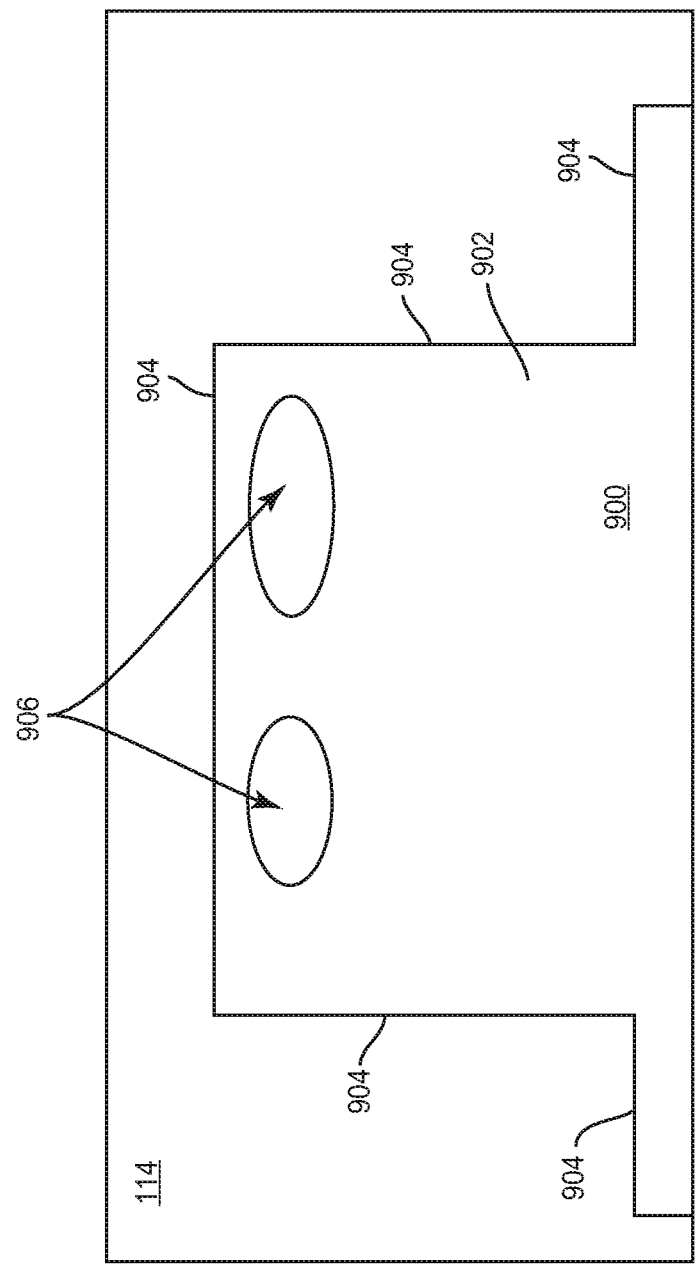
FIG. 16 illustrates a partial sectional view of yet another embodiment of a block with openings that form interlocked connections within a semiconductor package.

FIG. 16 illustrates yet another embodiment of the block 900. The embodiment shown in FIG. 16 is similar to the one shown in FIG. 15, however all of the openings 906 have an elliptical shape instead of a circular shape. One, some or all of the openings 906 can have yet other shapes such as square, rectangular, triangular, trapezoidal, etc.

Figure 17:
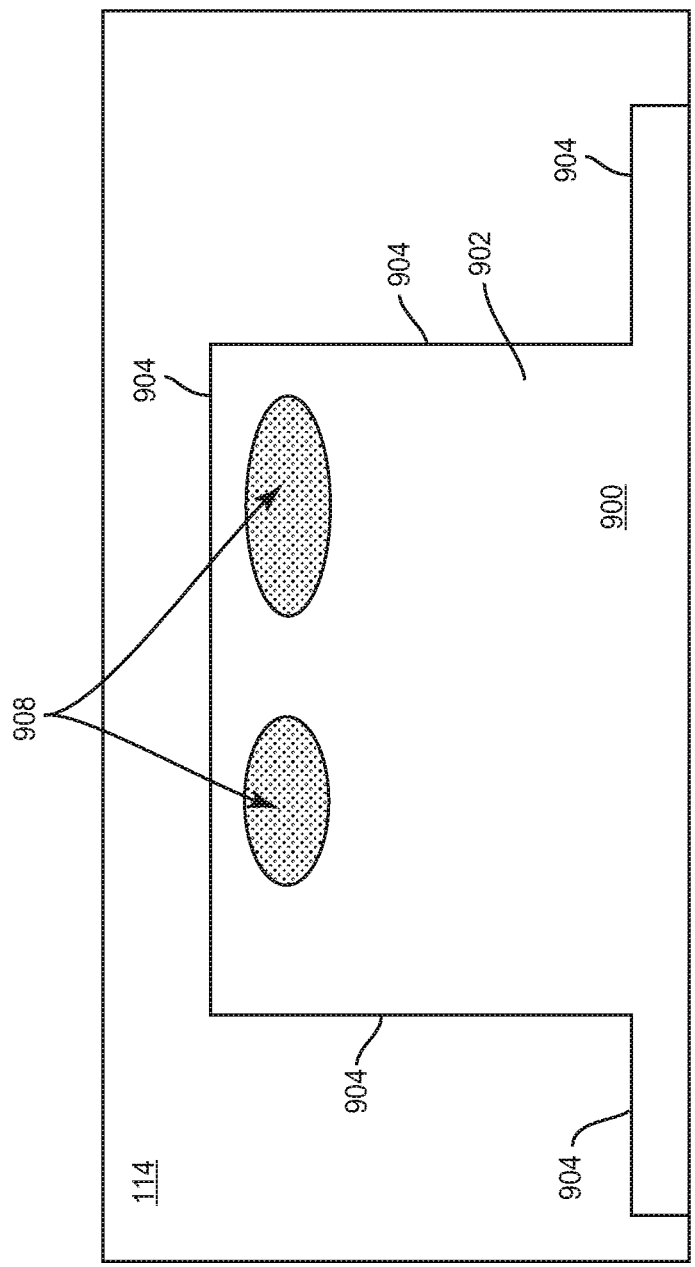
FIG. 17 illustrates a partial sectional view of an embodiment of a block with recessed regions that form interlocked connections within a semiconductor package.

FIG. 17 illustrates another embodiment of the block 900. The embodiment shown in FIG. 17 is similar to the one shown in FIG. 16, however one or both of the main surfaces of the block 900 have recessed regions 908 instead of or in addition to openings 906. The recessed regions 908 do not extend completely through the block 900 from one main surface to the other main surface, as indicated by the shaded regions in FIG. 17. The encapsulation material 114 fills the recessed regions 908, forming an interlocked connection between the block 900 and the encapsulation material 114. The recessed regions 908 can have any suitable shape such as circular, elliptical, square, rectangular, triangular, trapezoidal, etc.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor package, comprising:
a support substrate having opposing first and second main surfaces and sides extending between the first and second main surfaces;
a semiconductor die attached to the first main surface of the support substrate;
an electrically conductive lead separate and spaced apart from the support substrate, and
an encapsulation material at least partly covering the support substrate, the semiconductor die and the electrically conductive lead, the encapsulation material comprising a bottom side that is coplanar with the second main surface of the support substrate and a top side that is vertically spaced apart from the bottom side,
wherein the support substrate comprises a first protrusion extending outward from a side of the support substrate, the first protrusion forming an interlocked connection with the encapsulation material, and terminating in the encapsulation material, wherein the first protrusion comprises a narrower portion and a wider portion, the narrower portion being arranged closer to the support substrate than the wider portion, wherein the first protrusion has a completely curved perimeter, wherein the electrically conductive lead has a first part covered by the encapsulation material and a second part uncovered by the encapsulation material.

2. The semiconductor package of claim 1, wherein the interlocked connection between the first protrusion and the encapsulation material is a dovetail joint with the first protrusion forming a tenon of the dovetail joint and a region of the encapsulation material adjacent the first protrusion forming a mortise of the dovetail joint.

3. The semiconductor package of claim 1, wherein a first side of the first protrusion has a negative slope with respect to the side of the support substrate from which the first protrusion extends, and wherein a second side of the first protrusion has a positive slope with respect to the side of the support substrate from which the first protrusion extends.

4. The semiconductor package of claim 1, wherein the first protrusion extends outward from the side of the support substrate in the same plane as the support substrate.

5. The semiconductor package of claim 1, wherein the support substrate is a metal block and the first protrusion is a single continuous part of the metal block.

6. The semiconductor package of claim 1, further comprising a plurality of spaced apart protrusions extending outward from a side of the support substrate and terminating in the encapsulation material, the plurality of protrusions forming the interlocked connection with the encapsulation material.

* * * * *